US009588424B2

(12) United States Patent
Umeda et al.

(10) Patent No.: US 9,588,424 B2
(45) Date of Patent: Mar. 7, 2017

(54) PHOTOSENSITIVE RESIN COMPOSITION FOR SCREEN PRINTING, PHOTOSENSITIVE FILM, AND SCREEN PLATE

(71) Applicant: SUNTYPE CO., LTD., Saitama, Saitama-pref. (JP)

(72) Inventors: Yoshio Umeda, Saitama (JP); Kenji Ota, Saitama (JP); Yuichi Ono, Saitama (JP); Taichi Okada, Saitama (JP); Yukina Kuwahara, Saitama (JP); Takafumi Somei, Saitama (JP); Setsuka Nakajima, Saitama (JP); Masataka Miyazaki, Saitama (JP); Toru Mori, Saitama (JP); Suguru Komatsu, Saitama (JP); Michihiro Iljima, Tochigi (JP)

(73) Assignee: SUNTYPE CO., LTD., Saitama (JP)

( * ) Notice: Subject to any disclaimer, the term of this patent is extended or adjusted under 35 U.S.C. 154(b) by 24 days.

(21) Appl. No.: 14/423,576

(22) PCT Filed: Sep. 25, 2012

(86) PCT No.: PCT/JP2012/075283
§ 371 (c)(1),
(2) Date: Feb. 24, 2015

(87) PCT Pub. No.: WO2014/049882
PCT Pub. Date: Apr. 3, 2014

(65) Prior Publication Data
US 2015/0212413 A1 Jul. 30, 2015

(51) Int. Cl.
C08F 2/46 (2006.01)
C08G 61/04 (2006.01)
G03F 7/038 (2006.01)
G03F 7/027 (2006.01)
G03F 7/12 (2006.01)
G03F 7/021 (2006.01)

(52) U.S. Cl.
CPC ............ G03F 7/0384 (2013.01); G03F 7/021 (2013.01); G03F 7/027 (2013.01); G03F 7/0215 (2013.01); G03F 7/12 (2013.01); Y10T 428/24802 (2015.01)

(58) Field of Classification Search
CPC ........ G03F 7/0384; G03F 7/027; G03F 7/021; G03F 7/12; G03F 7/0215; Y10T 428/24802

USPC .................................................. 522/1; 520/1
See application file for complete search history.

(56) References Cited

U.S. PATENT DOCUMENTS 3,246,986 A * 4/1966 Borchers ................ C08G 12/08
430/170
4,960,671 A 10/1990 Dickinson

FOREIGN PATENT DOCUMENTS

| JP | 53-51004 | | 5/1978 | |
| JP | 61-501596 | A | 7/1986 | |
| JP | 03-274044 | A | 12/1991 | |
| JP | 04-19542 | A | 1/1992 | |
| JP | 04-19543 | A | 1/1992 | |
| JP | 04-369652 | A | 12/1992 | |
| JP | H05-125031 | * | 5/1993 | |
| JP | 07-53777 | A | 2/1995 | |
| JP | 07-146549 | A | 6/1995 | |
| JP | 08-202036 | A | 8/1996 | |
| JP | 11-344801 | A * | 12/1999 | ............ G03F 7/004 |
| JP | 2001-133976 | * | 5/2001 | |
| JP | 2001-133976 | A | 5/2001 | |
| JP | 2002-251007 | A | 9/2002 | |
| JP | 2005-221990 | A | 8/2005 | |
| JP | 2012-215862 | A | 11/2012 | |

OTHER PUBLICATIONS

Kaneda et al, JP 2001-133976 Machine translation, May 2001.*
Iida et al, JP H05-125031 Machine translation, May 1993.*
International Search Report of the International Searching Authority mailed Dec. 25, 2012 for the corresponding international application No. PCT/JP2012/075283 (and English translation).

* cited by examiner

Primary Examiner — Ling Choi
Assistant Examiner — Jessica E Whiteley
(74) Attorney, Agent, or Firm — Posz Law Group, PLC

(57) ABSTRACT

A photosensitive resin composition is prepared by dispersing at least one of a hydrophobic polymer and a mixture of an oil-soluble photopolymerization initiator and a water-insoluble or sparingly water-soluble compound having at least one photoactive, ethylenically unsaturated group in an aqueous solution that contains both a water-soluble polymer and a diazo resin is obtained by condensing a water-soluble salt of an optionally substituted 4-diazodiphenylamine with formaldehyde in the presence of sulfuric acid and phosphoric acid. This photosensitive resin composition gives a photosensitive film having excellent stability over time and a wide exposure latitude. By adding a specific fluorine compound to the photosensitive resin composition, a screen plate has an excellent discharge performance.

19 Claims, No Drawings

PHOTOSENSITIVE RESIN COMPOSITION FOR SCREEN PRINTING, PHOTOSENSITIVE FILM, AND SCREEN PLATE

CROSS REFERENCE TO RELATED APPLICATIONS

This application is a U.S. national stage application of the International Patent Application No. PCT/JP2012/075283 filed on Sep. 25, 2012, the disclosure of which is incorporated herein by reference.

TECHNICAL FIELD

The present invention relates to a diazo resin with which it is possible to give a photosensitive film having an excellent stability over time and a wide exposure latitude, a photosensitive resin composition for a screen plate which contains this diazo resin, a photosensitive film, and a screen plate.

BACKGROUND ART

Various types of photosensitive resin compositions are used today in, for example, printing plates, screens for textile printing, and photoresists for fabricating electronic components, or as vehicles in paints, adhesives and printing inks.

For example, when forming a pattern for a printing plate, a negative film or positive film corresponding to a pattern is placed on a photosensitive resin composition layer formed as a film, and light such as ultraviolet rays is irradiated from above the film, thereby exposing portions of the photosensitive resin composition layer. This is followed by development utilizing a difference in solubility with respect to a developer based on a change in chemical structure between exposed areas and unexposed areas, yielding the desired pattern. In order to form a precise and accurate pattern, basic conditions such as a high exposure sensitivity and good developability and resolution are required of the photosensitive resin composition used for such applications and of the photosensitive film obtained by forming this photosensitive resin composition into a film. In addition, storage stability for ensuring the stability of performance is also required. Moreover, in addition to toughness and dimensional stability for ensuring stable printing, the photosensitive film that has been exposed and developed (printing plate) is also required to have durability (solvent resistance, water resistance) to the printing inks, printing plate wash fluids, moisture in air, etc. that are encountered in the course of printing operations and storage.

Emulsified compositions obtained by dispersing a hydrophobic polymer or a mixture of a photopolymerization initiator with a monomer in an aqueous solution containing a water-soluble photocrosslinking agent such as a diazo resin and a polyvinyl alcohol, etc. are known as photosensitive resin compositions for producing such printing plates, and especially screen printing plates.

For example, Japanese Patent Application Laid-open No. S53-51004 (referred to below as "Patent Document 1") discloses a photosensitive resin composition that includes a polyvinyl alcohol having an average degree of polymerization of at least 1,100 and a degree of saponification of from 75 to 95 mol %, a polyvinyl acetate emulsion or a vinyl acetate-ethylenically unsaturated monomer copolymer emulsion, and a photocrosslinking agent having two or more diazo groups on the molecule (diazo resin).

Japanese Examined Patent Publication No. H4-19542 (referred to below as "Patent Document 2") discloses a photosensitive resin composition obtained by the emulsification, in an aqueous solution of a partially saponified vinyl acetate polymer having a degree of saponification of from 70 to 95 mol % which contains a water-soluble photocrosslinking agent such as a diazo resin, of a photopolymerization initiator-containing compound that is water-insoluble or sparingly water-soluble and has one, two or more ethylenically unsaturated groups.

In addition, Japanese Examined Patent Publication No. H4-19543 (referred to below as "Patent Document 3") discloses a photosensitive resin composition obtained by the dispersion, in an aqueous solution of a partially saponified vinyl acetate polymer having a degree of saponification of from 70 to 99 mol % which contains a water-soluble photocrosslinking agent such as a diazo resin or of a partially saponified vinyl acetate polymer having a degree of saponification of from 70 to 99 mol % which contains photocrosslinking groups, of a water-insoluble or sparingly water-soluble, photoactive compound having one, two or more ethylenically unsaturated groups which includes hydrophobic polymer particles and a photopolymerization initiator.

The water-soluble crosslinking agent, i.e., a diazo resin, exerts the greatest influence on the performance of these photosensitive resin compositions. The general synthesis of diazo resins is described on p. 111 of Kankō-sei kōbunshi [Photosensitive polymers] by M. Nagamatsu and H. Inui, pp. 109 to 115, published in 1977 by Kodansha, Ltd. (referred to below as "Non-Patent Document 1"), and in German Patent No. 576731 assigned to Kalle A. G. (referred to below as "Patent Document 4").

However, the photosensitive resin compositions described in Patent Documents 1 to 3, when stored for one week or more, readily change over time. Particularly in the summertime, they sometimes gel in several days, depending on the condition in which they are stored. Hence, as indicated in column 7 of Patent Document 2 and in column 12 of Patent Document 3, the photocrosslinking agent such as a diazo resin is added immediately before use.

Also, the diazo resins that have hitherto generally been used as water-soluble photocrosslinking agents are diazo resins obtained by condensing a 4-diazodiphenylamine water-soluble salt and paraformaldehyde in sulfuric acid or phosphoric acid (in the diazo resin production examples in Patent Documents 2 and 3, condensation is carried out in sulfuric acid). However, as mentioned above, photosensitive resin compositions that use a diazo resin condensed in sulfuric acid have a poor stability over time. Although photosensitive resin compositions which use a diazo resin condensed in phosphoric acid are relatively stable, they have a low exposure sensitivity; only photosensitive films having a narrow exposure latitude are obtained from such compositions. Another drawback is the inadequate solvent resistance of the photosensitive film following exposure and development.

Moreover, Patent Document 4 and Non-Patent Document 1 merely show the ordinary synthesis of diazo resins. Substantially no investigations have hitherto been conducted on diazo resins capable of forming photosensitive films having both excellent stability over time and a wide exposure latitude.

DISCLOSURE OF THE INVENTION

This invention was conceived of in light of the above-described background art. The object of this invention is to provide a diazo resin with which it is possible to form a photosensitive film having both excellent stability over time and a wide exposure latitude, a photosensitive resin composition which uses this diazo resin, a photosensitive film formed from this photosensitive resin composition, and a screen-printing plate composed of such a photosensitive film. A further object of the invention is to provide, by the use of a photosensitive film suitable for giving a photosensitive film which, in addition to having both excellent stability over time and a wide exposure latitude, is endowed in particular with, among the water resistance, solvent resistance and chemical resistance following exposure and development of the photosensitive film, an especially outstanding solvent resistance, a screen plate which is well-adapted for screen printing.

The inventors have conducted extensive investigations in order to achieve the above objects. As a result, they have discovered that a photosensitive resin composition which uses, as the water-soluble photocrosslinking agent, a diazo resin condensed in sulfuric acid and phosphoric acid provides a photosensitive film and screen plate which have both excellent stability over time and a wide exposure latitude.

Accordingly, the invention relates to, first of all, a photocrosslinkable, water-soluble diazo resin obtained by condensing a water-soluble salt of an optionally substituted 4-diazodiphenylamine with formaldehyde in the presence of sulfuric acid and phosphoric acid.

As already mentioned, photosensitive resin compositions which use a diazo resin condensed in sulfuric acid have a poor stability over time. By contrast, photosensitive resin compositions which use a diazo resin condensed in phosphoric acid are relatively stable, yet only photosensitive films having a narrow exposure latitude can be obtained from such compositions. In light of this, it comes as a surprise to learn that photosensitive resin compositions and photosensitive films which use diazo resins condensed in sulfuric acid and phosphoric acid have the outstanding effects of being endowed with an excellent stability over time, and moreover that photosensitive films having a wide exposure latitude can be obtained from such compositions. Although the reasons for this are not entirely clear, it is thought that, even though a diazo resin condensed in sulfuric acid and phosphoric acid includes 4-diazodiphenylamine hydrogen sulfate as a basic component making up the resin, in an emulsified photosensitive composition containing water, phosphate ions and sulfate ions are released, and the released phosphate ions act upon each of the components of the photosensitive resin composition, thereby affecting the stability over time and exposure latitude width of the photosensitive film.

In the diazo resin of the invention, the weight ratio of the sulfuric acid to the phosphoric acid is preferably in the range of 0.5:99.5 to 99.5:0.5, and the molar ratio of the water-soluble salt of the optionally substituted 4-diazodiphenylamine to the formaldehyde is preferably in the range of 1:0.5 to 1:3.0. The photosensitive resin composition and the photosensitive film which use a diazo resin condensed in this range have an excellent stability over time and exposure latitude. The water-soluble salt of the optionally substituted 4-diazodiphenylamine is preferably 4-diazodiphenylamine hydrogen sulfate or 4-diazo-3-methoxydiphenylamine hydrogen sulfate because these are readily available.

In an especially preferred embodiment, the weight ratio of the sulfuric acid to the phosphoric acid is in the range of 40:60 to 60:40, and the molar ratio of the optionally substituted 4-diazodiphenylamine water-soluble salt to formaldehyde is in the range of 1:0.75 to 1:1.1. By using a diazo resin produced in this range, photosensitive resin compositions and photosensitive films of particularly excellent stability over time can be obtained. In another especially preferred embodiment, the weight ratio of the sulfuric acid to the phosphoric acid is in the range of 5:95 to 20:80, and the molar ratio of the optionally substituted 4-diazodiphenylamine water-soluble salt to formaldehyde is in the range of 1:1.1 to 1:3. By using a diazo resin produced in this range, there can be obtained a photosensitive film which has a particularly outstanding exposure latitude and moreover affords, following exposure and development, a cured resin of excellent solvent resistance.

This invention additionally relates to a photosensitive resin composition obtained by dispersing, in an aqueous solution containing (A) the diazo resin and (B) a water-soluble polyol selected from polyvinyl alcohol and partially saponified polyvinyl alcohol: (C) (c-1) a mixture of an oil-soluble photopolymerization initiator and a water-insoluble or sparingly water-soluble compound having at least one photoactive, ethylenically unsaturated group, and/or (c-2) a hydrophobic polymer.

This photosensitive resin composition is able to provide a photosensitive film having excellent stability over time and a wide exposure latitude, and is particularly suitable for the production of screen plates. Accordingly, the invention further relates to a photosensitive film and obtained by forming the photosensitive resin composition into a film and also to a screen plate.

The foregoing photosensitive resin composition which uses the diazo resin of the invention, and the foregoing photosensitive film obtained by forming this photosensitive resin composition into a film have an excellent stability over time and can be stored for a long period of time (at least about several months). Also, the photosensitive film of the invention has a wide exposure latitude, making it possible to obtain a stably finished screen plate even without carrying out strict control of the exposure conditions.

BEST MODE FOR CARRYING OUT THE INVENTION

The invention is described more fully below.

I. Diazo Resin

The photocrosslinkable, water-soluble diazo resin of the invention is obtained by condensing a water-soluble salt of an optionally substituted 4-diazodiphenylamine with formaldehyde in the presence of sulfuric acid and phosphoric acid.

The water-soluble salt of an optionally substituted 4-diazodiphenylamine may be a water-soluble salt, such as a hydrochloride, hydrogen sulfate or hydrogen phosphate, of 4-diazodiphenylamine which may be substituted with, e.g., an alkyl group, an alkoxy group, a halogen atom or a nitro group. These water-soluble salts of 4-diazodiphenylamine may be used as a solitary compound or may be used as a mixture.

Illustrative examples of the water-soluble salt of an optionally substituted 4-diazodiphenylamine include hydrogen sulfates, hydrogen phosphates and hydrochlorides of 4-diazodiphenylamine, 4-diazo-3-methoxydiphenylamine, 4-diazo-4'-methoxydiphenylamine, 4-diazo-3-methyldiphenylamine, 4-diazo-4'-methyldiphenylamine, 4-diazo-3-ethoxydiphenylamine and 4-diazo-4'-ethoxydiphenylamine. Of these, 4-diazodiphenylamine hydrogen sulfate and 4-diazo-3-methoxydiphenylamine hydrogen sulfate are preferred because, among other reasons, they are readily available.

The formaldehyde is typically used in the form of paraformaldehyde powder having a purity of at least 90%. The amount of formaldehyde used (when paraformaldehyde is used, the amount of use expressed in terms of formaldehyde) is generally in the range of from 0.5 to 3.0 moles per mole of the water-soluble salt of the optionally substituted 4-diazodiphenylamine. At a molar ratio of the water-soluble salt of an optionally substituted 4-diazodiphenylamine to formaldehyde in the range of 1:0.5 to 1:1.1, and most preferably in the range of 1:0.65 to 1:1.05, a photosensitive resin composition and a photosensitive film having a particularly outstanding stability over time can be obtained. Alternatively, at a molar ratio of the water-soluble salt of an optionally substituted 4-diazodiphenylamine to formaldehyde in the range of 1:1.1 to 1:3.0, and most preferably in the range of 1:1.5 to 1:2.1, there can be obtained both a photosensitive film which has a particularly outstanding exposure latitude and which, moreover, following exposure and development, gives a cured resin of excellent solvent resistance, and also a screen plate composed of such a photosensitive film.

The sulfuric acid used in this invention is dilute sulfuric acid having a concentration of from 70 to 99%, and preferably from 75 to 90%. The degree of condensation of the diazo resin increases with the sulfuric acid concentration. That is, at a high sulfuric acid concentration, the exposure sensitivity of the diazo resin rises. The phosphoric acid used preferably has a concentration of 85%, but is not limited to this concentration. The dispersibility of the water-soluble salt of 4-diazodiphenylamine rises on account of the phosphoric acid. Aside from the orthophosphoric acid that is commonly referred to as phosphoric acid, the phosphoric acid used here may be an aqueous solution of a condensed compound having a phosphoric acid skeleton, such as pyrophosphoric acid. The weight ratio of the sulfuric acid to the phosphoric acid (in cases where a condensed compound is used, the amount of use expressed in terms of phosphoric acid) is generally from 0.5:99.5 to 99.5:0.5. At a weight ratio of sulfuric acid to phosphoric acid of from 40:60 to 60:40, a photosensitive resin composition and a photosensitive film exhibiting an especially outstanding stability over time are obtained. When the weight ratio of sulfuric acid to phosphoric acid is in the range of 5:95 to 20:80, there can be obtained both a photosensitive film which has a particularly outstanding exposure latitude and which, moreover, following exposure and development, gives an exposed and developed film of excellent solvent resistance, and also a screen plate composed of such a photosensitive film.

The diazo resin can be obtained by dissolving or dispersing the water-soluble salt of 4-diazodiphenylamine in sulfuric acid and phosphoric acid under stirring, gradually adding paraformaldehyde at at most room temperature and stirring for a period of from one to several hours at room temperature, and, if necessary, additionally stirring at 30 to 40° C. for a period of one to three hours, then dispersing the mixture in a large volume of methyl alcohol, ethyl alcohol, isopropyl alcohol or the like and leaving the system at rest. The precipitate is subsequently vacuum-filtered and dried under normal pressure or in a vacuum.

If the reaction is carried out at a low reaction temperature of 10° C. or below, regardless of the reaction time, unreacted paraformaldehyde remains and the storage stability of the inventive photosensitive composition or a photosensitive film for screen printing made thereof is markedly diminished, which is undesirable.

In the case of such a diazo condensation reaction, moisture is readily absorbed, and the diazo resin in particular tends to become tarry in the production step. By adding an organic acid such as citric acid, tartaric acid, malic acid or gluconic acid as a stabilizer at the time of the reaction, the stability over time of the resulting diazo resin can be enhanced.

II: Photosensitive Resin Composition

The photosensitive resin composition of the invention is a photosensitive resin composition for a screen plate which is obtained by dispersing, in an aqueous solution containing
  (A) a diazo resin and
  (B) a water-soluble polymer selected from polyvinyl alcohol and partially saponified polyvinyl alcohol,
  (C) at least one of (c-1) and (c-2) below:
    (c-1) a mixture of an oil-soluble photopolymerization initiator with a water-insoluble or sparingly water-soluble compound having at least one photoactive ethylenically unsaturated group, and
    (c-2) a polymer emulsion.

The ingredients are each described below.

(A) Diazo Resin

The diazo resin used in this invention may be a single diazo resin or may be a mixture of different diazo resins. Component (A) is used in an amount that is preferably in the range of 0.1 to 100 parts by weight, and more preferably in the range of 1 to 10 parts by weight, per 100 parts by weight of the water-soluble polymer of component (B) shown below.

(B) Water-Soluble Polymer

The photosensitive resin composition of the invention includes a polyvinyl alcohol and/or a partially saponified polyvinyl alcohol as the water-soluble polymer.

In this invention, "polyvinyl alcohol" refers to a polymer having a structure in which substantially all of the ester bonds present in a molecule of vinyl acetate homopolymer are saponified; that is, a polymer which includes, among the structural units of the polymer, substantially nothing other than vinyl alcohol units. "Partially saponified polyvinyl alcohol" refers to a polymer which includes, among the structural units of the polymer, structural units other than vinyl alcohol units. This includes not only polymers having a structure in which at least some of the ester bonds present in a molecule of vinyl acetate homopolymer are saponified, but also polymers of a form where vinyl alcohol has been copolymerized with another comonomer, and polymers of a form where polyvinyl alcohol has been subjected to urethane formation, acetalization, etherification, esterification, sulfonation, cationization or the like. These polyvinyl alcohols or partially saponified polyvinyl alcohols may be used singly or may be used as a mixture of two or more thereof.

In a partially saponified polyvinyl alcohol of a form where vinyl alcohol has been copolymerized with another comonomer, examples of the comonomer that may be copolymerized include α-olefins such as ethylene and propylene; unsaturated carboxylic acids such as acrylic acid and methacrylic acid; acrylates such as methyl acrylate and methyl methacrylate; acrylamides such as acrylamide, methacrylamide and diacetone acrylamide; and cationic monomers such as dimethylaminoethyl methacrylate, vinyl imidazole, vinyl pyridine and vinyl succinamide.

The partially saponified polyvinyl alcohol may include photocrosslinkable groups. A preferred example is a partially saponified polyvinyl alcohol having structural moieties with styrylpyridinium groups. These photocrosslinkable groups can be introduced by the acetalization of polyvinyl alcohol or a partially saponified polyvinyl alcohol lacking such groups using alcoholic hydroxyl groups.

These polymers can be obtained, by reacting polyvinyl alcohol or a partially saponified polyvinyl alcohol with a formyl group-containing styrylpyridinium salt in an aqueous solution and under acidic conditions such as in the presence of phosphoric acid.

In a partially saponified polyvinyl alcohol to which styrylpyridinium groups have been added, these groups are preferably included in an amount of from 0.3 to 20 mol % of the constituent units on the partially saponified polyvinyl alcohol. At less than 0.3 mol %, the desired photocrosslinkability is not obtained, whereas at more than 20 mol %, the water solubility of the polymer decreases.

Specifically, component (B) is preferably a partially saponified polyvinyl alcohol to which from 0.9 to 2.0 mol % of styrylpyridinium groups have been added by an acetalization reaction of a partially saponified polyvinyl alcohol polymer having a degree of saponification of 88 mol % (weight-average degree of polymerization, 1,000 to 1,700) with N-methyl-γ-(p-formylstyryl)pyridinium methosulfate or a partially saponified polyvinyl alcohol to which from 0.7 to 1.0 mol % of styrylpyridinium groups have been added by an acetalization reaction of a partially saponified polyvinyl alcohol polymer having a degree of saponification of 88 mol % (degree of polymerization, 2,000 to 2,500) with N-methyl-γ-(p-formylstyryl)pyridinium methosulfate.

To achieve a photosensitive resin composition from which there can be obtained a photosensitive film which is water-developable and which, after being photocured, has an excellent solvent resistance and water resistance, the degree of saponification (mol % of vinyl alcohol units with respect to structural units on the polymer) in the polyvinyl alcohol and partially saponified polyvinyl alcohol is preferably in the range of from 70 to 99 mol %. Also, for the same reasons, the degree of polymerization is preferably in the range of 300 to 3,000. In addition, a partially saponified polyvinyl alcohol having a degree of saponification of 88±2 mol % and a viscosity, when measured as a 4% aqueous solution (20° C.), of from 20 to 50 mPa·S is especially preferred.

Specific examples of such partially saponified polyvinyl alcohols include the following commercial products: Gohsenol GM-14, GH-17, GH-20 and GH-23, available from Nippon Synthetic Chemical Industry Co., Ltd.; and Kuraray Poval (PVA) 105, 110, 117, 117H, 120, 124, 124H, CS, CST, HC, 203, 204, 205, 210, 217, 220, 224, 217EE, 217E, 220E, 224E, 405, 420, 613 and L-8, available from Kuraray Co., Ltd. Where necessary, a suitable amount of polyvinyl alcohol having a low molecular weight (degree of polymerization, 1,500 or less; e.g., Kuraray Poval 205, available from Kuraray Co., Ltd.), polyvinyl alcohol having a low degree of saponification (degree of saponification, 70 to 86 mol %; e.g., Gohsenol KL-05, available from Nippon Synthetic Chemical Industry Co., Ltd.), or modified polyvinyl alcohol (e.g., obtained by copolymerization with maleic acid, itaconic acid or the like; e.g., Gohsenol T-330, available from Nippon Gohsei Chemical Industry Co., Ltd.) may be added to the above-indicated especially preferred partially saponified polyvinyl alcohol.

Component (C) is Composed of Component (c-1) and/or Component (c-2) Below.

(c-1) Oil-Soluble Photopolymerization Initiator and Water-Insoluble or Sparingly Water-Soluble Compound Having and at Least One Photoactive Ethylenically Unsaturated Group The water-insoluble or sparingly water-soluble compound having one or more photoactive, ethylenically unsaturated group which is used in the invention (sometimes referred to below simply as "photoactive unsaturated compound") may be a compound which is insoluble or sparingly soluble in water and has one or more photoactive, ethylenically unsaturated group, such as an acryloyl group, methacryloyl group, aryl group, vinyl ether group, acrylamide group or methacrylamide group. Illustrative examples of compounds which may be used are listed below. Here and below, the term "(meth)acrylate" means methacrylate or acrylate, and the term "ethy(propy)lene" means ethylene or propylene.

Examples of monofunctional compounds include methyl (meth)acrylate, ethyl(meth)acrylate, propyl(meth)acrylate, butyl(meth)acrylate, hexyl(meth)acrylate, 2,8-dibromopropyl(meth)acrylate, lauryl(meth)acrylate, stearyl(meth)acrylate, 2-decyltetradecanyl(meth)acrylate, 2-ethylhexyl(meth)acrylate, isodecyl(meth)acrylate, 2-hydroxyethyl(meth)acrylate, 2-hydroxypropyl(meth)acrylate, 2-hydroxybutyl (math)acrylate, 2-ethoxyethyl(meth)acrylate, 2(2-ethoxyethoxy)ethyl(meth)acrylate, n-butoxyethyl(meth)acrylate, morpholinoethyl(meth)acrylate, benzyl(meth)acrylate, phenyl(meth)acrylate, phenoxyethyl(meth)acrylate, 2-hydroxy-3-phenoxypropyl(meth)acrylate, phenoxydiethylene glycol (meth)acrylate, m-phenoxybenzyl(math)acrylate, nonylphenoxy(meth)acrylate, methylphenoxyethyl(meth)acrylate, methoxydiethylene glycol (meth)acrylate, methoxytriethy(propy)lene glycol (meth)acrylate, methoxytetraethy(propy)lene glycol (meth)acrylate, polyethy(propy)lene glycol (meth)acrylate, ethoxydiethy(propy)lene glycol (meth)acrylate, ethoxytriethy(propy)lene glycol (meth)acrylate, cyclohexyl(meth)acrylate, tetrahydrofurfuryl(meth)acrylate, isobornyl(meth)acrylate, dicyclopentanyl(meth)acrylate, N,N-dimethylaminoethyl (meth)acrylate, N,N-diethylaminoethyl(meth)acrylate and oxide-modified phosphoric acid (meth)acrylate, fluorinated (meth)acrylates such as trifluoroethyl(meth)acrylate, tetrafluoropropyl(meth)acrylate and octafluoropentyl(meth)acrylate; and also 3-(meth)asryloxytrimethoxysilane, and the addition product of 2-carboxyethyl(meth)acrylate and 3-glycidoxypropyl trimethoxysilane.

Examples of polyfunctional compounds include ethylene glycol di(meth)acrylate, diethylene glycol di(meth)acrylate, 1,3-trimethylene glycol di(meth)acrylate, 1,4-butanediol di(meth)acrylate, 1,6-hexanediol di(meth)acrylate, neopentyl glycol di(meth)acrylate, bis(acryloxyneopentyl glycol) adipate, bis(methacryloxyneopentyl glycol) adipate, epichlorohydrin-modified 1,6-hexanediol di(meth)acrylate, hydroxypivalic acid neopentyl glycol di(meth)acrylate, caprolactone-modified hydroxypivalic acid neopentyl glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethylene oxide and propylene oxide-modified bisphenol A di(meth)acrylate, trimethylolpropane tri(meth)acrylate, ditrimethylolpropane tri(meth)acrylate, neopentyl glycol-modified trimethylolpropane di(meth)acrylate, ethylene oxide-modified trimethylolpropane tri(meth)acrylate, propylene oxide-modified trimethylolpropane tri(meth)acrylate, hydroxypropyl acrylate-modified trimethylolpropane tri(meth)acrylate, pentaerythritol tri(meth)acrylate, amine-modified pentaerythritol tri(meth)acrylate, pentaerythritol tetra(meth)acrylate, stearic acid-modified pentaerythritol di(meth)acrylate, dipentaerythritol hexa(meth)acrylate, dipentaerythritol monohydroxy penta(meth)acrylate, amine-modified dipentaerythritol poly(meth)acrylate, caprolactone-modified dipentaerythritol poly(meth)acrylate, glycerol di(meth)acrylate, epichlorohydrin-modified glycerol tri (meth)acrylate, oxide-modified glycerol tri(meth)acrylate, tris(acryloxyethyl) isocyanurate, tris(methacryloxyethyl) isocyanurate, caprolactone-modified tris(acryloxyethyl)isocyanurate, caprolactone-modified tris(methacryloxyethyl)isocyanurate, oxide-modified bisphenol (meth)acrylate, trimethylolpropane polyglycidyl ether poly(meth)acrylate, polyester (meth)acrylate, bisphenol A-type epoxy(meth) acrylate and the caprolactone-adducts of (meth)acrylate, epoxy(meth)acrylates such as phenol novolak-type epoxy (meth)acrylates and cresol novolak-type epoxy(meth)acrylates, urethane (meth)acrylates, the ethoxy-modified (meth) acrylates of 1,1,2,2-tetrakis(4-hydroxyphenyl)ethane, tetrakis(4-glycidylphenyl)ethane (meth)acrylate, succinic acid- or phthalic acid-modified penta- and dipentaerythritol tri- and penta(meth)acrylates, and the compounds mentioned in the specification of Japanese Patent Application Laid-open No. 2011-132031 (the trimethoxysilane compounds obtained by adding 3-glycidoxypropyltrimethoxysilane to succinic acid- or phthalic acid-modified pentaerythritol triacrylate.

Illustrative examples of commercial products include Aronix M-211B, M-6100, M-6250, M-6500, M-8030 and M-7100 available from Toagosei Co., Ltd.; Kayarad R-128H, MANDA, R551, DPCA-20 and DPCA-30 available from Nippon Kayaku Co., Ltd.; fluorinated (meth) acrylates available from Kyoeisha Chemical Co., Ltd., such as LINC-102Aa, 162A, 2A, 3A, 4A, 151EPA, 152EPA, 101UA, 142UA, 162UA and 202UA; the perfluoroalkenyl group-containing (meth)acrylates used in Japanese Patent Application Laid-open Nos. 2009-25683 and 2011-57589; and amine-modified acrylates (Michael adducts) available from BASF, such as Laromer LR8812, LR8864, LR8894, LR8869 and IR8889.

These photoactive unsaturated compounds may be used singly or two or more may be used in combination. The amount used per 100 parts by weight of component (B) is preferably in the range of 0 to 200 parts by weight, and most preferably in the range of 1 to 100 parts by weight.

In this invention, the photoactive unsaturated compound is used together with a photopolymerization initiator. The photopolymerization initiator used is oil-soluble so as to be compatible with the water-insoluble or sparingly water-soluble photoactive unsaturated compound. For example, ketals such as benzyl dimethyl ketal, and liquid photopolymerization initiators such as benzoin-n-butyl ether or 2-hydroxy-2-methyl-1-phenylpropane-1-one are desirable. Examples of other suitable photopolymerization initiators include thioxanthene derivatives such as isopropylthioxanthone and diethylthioxanthone, aminoketone compounds such as benzoic acid esters (e.g., ethyl dimethylaminobenzoate, isobutyl dimethylaminobenzoate), and onium salts such as di(p-t-butylphenyl)iodonium hexafluorophosphate, di(p-n-amylphenyl)iodonium trifluorosulfonate and triphenylsulfonium-9,10-dimethoxyanthracene 2-sulfonate Specific examples of commercial products include Irgacure 184, 369, 651, 819, 907, OXE01, OXE02, LEAP and Darocur 1173, all available from BASF AG; highly photosensitive oxime compounds such as SOX 314 (1-(3-cyclopentyl-1-(9-ethyl-6-(thiophencarbonyl)-9H-carbazole-3-yl)propylidene aminoxy) ethanone) and SOX 315 (2-(acetoxyimino)-3-cyclopentyl-1-(4-(2-hydroxyethoxy)phenylthio)phenyl) propane-1-one), both available from Suntype Co., Ltd.; and boron compounds such as P3B and N3E, both available from Showa Denko KK.

These photopolymerization initiators may be used singly or in admixture. Use in an amount of from 0 to 1,000 parts by weight, and especially from 1 to 50 parts by weight, per 100 parts by weight of the photoactive unsaturated compound is preferred. This photopolymerization initiator and the photoactive unsaturated compound are used after complete dissolution of the photopolymerization initiator in the photoactive unsaturated compound, or after the addition of a solvent or the like and complete dissolution. These are included in a dispersed state within an aqueous solution containing components (A) and (B), and cure when the photosensitive resin composition is exposed to light.

(c-2) Polymer Emulsion

In the photosensitive resin composition of the invention, a hydrophobic polymer is included, either instead of or together with, above component (c-1). Examples of the hydrophobic polymer include water-insoluble partially saponified polyvinyl alcohols, polyvinyl acetate, vinyl acetate/ethylene copolymers, vinyl acetate/acrylic acid ester copolymers (examples of the acrylic acid ester being methyl acrylate, n-butyl acrylate, 2-ethylhexyl acrylate, fluorinated acrylates and silicone acrylates), (meth)acrylic acid ester copolymers (examples of the (meth)acrylic acid ester being methyl(meth)acrylate, n-butyl(meth)acrylate, and 2-ethylhexyl(meth)acrylate), styrene/butadiene copolymers, methyl methacrylate/butadiene copolymers, acrylonitrile/butadiene copolymers, chloroprene polymers, isoprene polymers, poly (meth)acrylic acid, polyvinyl chloride, polyvinylidene chloride, polystyrene, silicone resins, polyethylene, polyurethane and fluororesins.

Polymer Emulsion (Example of Polymerization)

A reaction vessel equipped with a stirrer, a reflux condenser, a dropping tank and a thermometer was charged with 540 parts by weight of water, following which 55 parts by weight of polyvinyl alcohol (abbreviated below as "PVA"; Kuraray Poval PVA 217EE, from Kuraray Co., Ltd.) and 1 part by weight of sodium bicarbonate were added and dissolved therein, and the resulting solution was held at 80° C. After the PVA had completely dissolved, a catalyst (the solution obtained by dissolving 2 parts by weight of azobisisovaleronitrile (V-59) in 25 parts by weight of methanol) was added to 376 parts by weight of a monomer solution (methyl methacrylate:2-ethylhexyl acrylate=1:1), and this mixture was continuously added dropwise (under nitrogen) over a period of 2 hours from the dropping tank. After the completion of dropwise addition, stirring was carried out for 1.5 hours to bring polymerization to completion, thereby giving a methyl methacrylate/2-ethylhexyl acrylate copolymer resin emulsion (polymer emulsion).

These polymer emulsions are added in order to confer the photosensitive film with water resistance and high resolution, with use in the range of 0 to 1,000 parts by weight, and especially in the range of 0 to 100 parts by weight, per 100 parts by weight of component (B) being preferred. These are included in a dispersed state within the aqueous solution containing components (A) and (B).

The photosensitive resin composition according to this invention is basically composed of the above components (A), (B) and (C), although additives ordinarily included in this type of photosensitive resin composition may also be included, if necessary. Examples of such optional additives include colorants such as dyes and pigments, fillers such as clay, talc and silica, silicon-based compounds such as polyorganosiloxanes and silane coupling agents, leveling agents such as fluorine compounds and fluorosurfactants, and also preservatives, mildewcides, surfactants, chelating agents and infrared absorbers.

An optional additive that is especially preferred for the photosensitive resin composition of the invention is a fluorine compound composed primarily of Existing Chemical Substance 7-1320. This enhances the screen platemaking ability and the screen printability, and has an especially outstanding electrical discharge performance. The fluorine compound added is preferably from 0.01 to 10 wt %, and more preferably from 0.1 to 5.0 wt %, of the emulsion. Addition of this fluorine compound is carried out by dissolution in an ethylenically unsaturated compound at the time of diazo resin production or at the time of emulsion production, or the fluorine compound is subsequently added to the emulsion.

From the standpoint of obtaining a stable emulsified composition, it is suitable for the amount of water in the photosensitive resin composition to be from 0.01 to 100 parts by weight per 100 parts by weight of the combined amount of components (B) and (C).

To obtain a photosensitive resin composition according to the invention from the various above ingredients, use may be made of, for example, the following method.

First, a diazo resin is prepared by the method described above. Separately, polyvinyl alcohol or partially saponified polyvinyl alcohol is dissolved in a given amount of water to form an aqueous solution. To this aqueous solution is added a uniform mixture of a photoactive unsaturated compound with a photopolymerization initiator and/or an aqueous emulsion of given amount of hydrophobic polymer, and mixing is carried out by stirring with a kneader or a screw-type mixer. To the resulting mixture is added a given amount of the prepared diazo resin and, where necessary, optional ingredients such as colorants and fillers, followed by stirring and mixing, yielding a photosensitive resin composition of the invention.

III: Photosensitive Film

To obtain a photosensitive film using the photosensitive resin composition of the invention, a photosensitive film is formed by repeatedly coating and drying the photosensitive resin composition of the invention on a base, such as a synthetic resin (e.g., polyester, nylon or polyethylene) or a plating of nickel or the like on such a resin, a metal vapor-deposited workpiece or a screen mesh made of stainless steel or the like, or the metal printing plate described in Japanese Patent No. 4634164.

Another possible method is one that involves coating the photosensitive resin composition of the invention onto a peelable film of polyethylene, polyvinyl chloride, polyester or the like and drying to obtain an applied film, then transferring this applied film onto a screen mesh while applying water or the inventive photosensitive resin composition. This method is referred to as a "direct/indirect" method; compared with a method in which the photosensitive resin composition is repeatedly coated onto a screen mesh (direct method), the work is easier to carry out and screen printing plates composed of photosensitive film having excellent printability can be manufactured. Another method that may be used is one in which the photosensitive resin composition of the invention is transferred to a screen after platemaking on a peelable film (indirect method).

IV: Screen Plate

Using the photosensitive composition of the invention, a photosensitive film is formed on the base described above. The original to be reproduced is then either vacuum-contacted to the photosensitive film or is written directly onto the photosensitive film using an inkjet printer, following which the photosensitive film is exposed by the irradiation of actinic light using a light source (illustrative examples of the light source include mercury vapor lamps, metal halide lamps and LEDs) which generates copious actinic light such as ultraviolet light and is then developed, thereby giving a film suitable for screen printing. Moreover, the invention, by using a preferred photosensitive film that gives an exposed and developed film which, of water resistance, solvent resistance and chemical resistance, is endowed in particular with solvent resistance, provides a screen plate suitable for screen printing. In recent years, because the use of direct platemaking systems-commonly referred to as computer-to-plate (CTP) systems—which employ, for example, ultraviolet and infrared lasers has become widespread, photosensitive films are now required to have photosensitivity, resolution and storage stability, and screen plates are required to have further water resistance, chemical resistance, and solvent resistance to special solvents.

Given the above, post-treatments such as the following are carried out in order to enhance the performance of the photosensitive film.

(1) The surface of the photosensitive film is overcoated.
(2) Photosensitive compositions of differing properties are multiply coated.
(3) The film obtained by light exposure and development of the photosensitive film is reinforced using a screen plate reinforcing solution.
(4) The surface of the film obtained by light exposure and development of the photosensitive film is overcoated.

(1) The overcoats here can be broadly divided into those of a type that are removed by development and those of a type that remain behind.

Overcoats removed by development that are suitable for this invention are exemplified by water-soluble polymers.

Examples of such water-soluble polymers include the polyvinyl alcohols mentioned on page 11, lines 17 to 24 of this Specification, and the commercial products mentioned on page 11, line 25 to page 12, line 12. Examples of water-soluble polymers other than polyvinyl alcohols include polysaccharides such as pullulan (Hayashibara), starch, dextrin and β-glucan, and natural products such as collagen, chitin and chitosan.

In addition to the oxygen-blocking effect that is the purpose of such overcoats, to obtain also water-repelling and oil-repelling effects at the surface of the film, the silicon compounds and silicon-based surfactants such as polyorganosiloxanes and silane coupling agents (e.g., KBM-5103, from Shin-Etsu Chemical Co., Ltd.) and the leveling agents such as fluorine compounds and fluorosurfactants mentioned on page 19, lines 4 to 11 may be added.

Overcoats which remain behind with development that are preferred for this invention are the inventive photosensitive compositions themselves. As mentioned above, use can be made of additives similar to those mentioned on page 19, lines 4 to 11 for obtaining an oxygen-blocking effect and a surface water-repelling and oil-repelling effect.

(2) Multiply coating photosensitive compositions of the invention refers to, for example, the ability to obtain a screen plate having a good solvent resistance and durability by using on the screen side of the plate a photosensitive composition having a good adherence to the screen, and using on the printing side a photosensitive composition having a good solvent resistance. A screen plate having good ink and paste removability can be created by adding the fluorine compounds mentioned on page 19, lines 4 to 11 to the photosensitive composition in an amount of addition which is larger on the printing side than on the screen side (squeegee side).

(3) Examples of screen plate reinforcing solutions which can be used in this invention include, as mentioned in Japanese Patent No. 2709770, a mixture composed of an acid such as dilute hydrochloric acid or p-toluenesulfonic acid with an aqueous solution of glyoxal and glutaraldehyde.

The screen plate reinforcing solution may have added thereto a lower alcohol (examples of such alcohols include methyl alcohol, ethyl alcohol and isopropyl alcohol) so as to increase—apart from the water resistance and solvent resistance—the resistance to chemicals (such chemicals being carriers, oxidizing agents, reducing agents and discharging agent used in textile printing), and also may have added thereto a polyol (examples of such polyols include ethylene glycol, propylene glycol and polyethylene glycol) so as to enhance the durability of the screen plate.

(4) The screen plate can clearly be modified by applying, for example, a urethane coating composed of polyester and an isocyanate compound, a silicone resin, or a fluororesin onto the printing surface side of the film obtained by exposing and developing the photosensitive film of the invention.

EXAMPLES

Examples of the invention are described below together with comparative examples, although the invention is not limited to these examples.

1. Production of Diazo

Example 1

4-Diazodiphenylamine hydrogen sulfate, 29.46 g (Diazo No. 1, from Resupe Chemical KK), was dissolved in 46.5 g of 85% sulfuric acid and 46.5 g of 85% phosphoric acid, after which 3.33 g of paraformaldehyde (reagent from Tokyo Chemical industry Co., Ltd.; purity, 90%) was poured in at 10° C. or below and stirring was carried out at room temperature for 2 hours. The resulting reaction mixture was dispersed in 1.3 liters of isopropyl alcohol and left at rest for 24 hours. The dispersion was then filtered, washed with 0.2 liter of isopropyl alcohol, and dried at at most 25° C., thereby giving 30.0 g of diazo resin (the reaction product of 1.0 mole of formaldehyde per 1.0 mole of a water-soluble salt of 4-diazodiphenylamine).

Example 2

4-Diazodiphenylamine hydrogen sulfate, 29.46 g (Diazo No. 1, from Resupe Chemical KK), was dissolved in 46.5 g of 90% sulfuric acid and 46.5 g of 89% phosphoric acid, after which 3.75 g of paraformaldehyde (reagent from Tokyo Chemical Industry Co., Ltd.; purity, 90%) was poured in at 10° C. or below and stirring was carried out at room temperature for 1 hour. The resulting reaction mixture was treated in the same way as in Example 1, thereby giving 30.4 g of a yellow diazo resin (the reaction product of 1.1 moles of formaldehyde per 1.0 mole of a water-soluble salt of 4-diazodiphenylamine).

Example 3

4-Diazodiphenylamine hydrogen sulfate, 30.0 g (Diazo No. 1, from Resupe Chemical KK), was dissolved in 4.5 g of 95% sulfuric acid and 60.0 g of 85% phosphoric acid, after which 4.34 g of paraformaldehyde (reagent from Aldrich Co.; purity, 95%) was poured in at 25° C. or below and stirring was carried out at room temperature for 1 hour, then at 40° C. for another 3 hours. The resulting reaction mixture was treated in the same way as in Example 1, giving 36.4 g of a yellow diazo resin (the reaction product of about 1.5 moles of formaldehyde per 1.0 mole of a water-soluble salt of 4-diazodiphenylamine). Next, 36.4 g of the resulting diazo resin was dissolved in 160 g of water, then dispersed in 1.3 liters of isopropyl alcohol and left at rest for 1 hour. This was then filtered, washed with 0.2 liter of isopropyl alcohol and dried at 50° C. or below, giving 27.8 g of purified diazo resin.

Example 4

4-Diazo-3-methoxydiphenylamine hydrogen sulfate, 35.0 g (Diazo No. 11, from Resupe Chemical KK), was dissolved in 4.5 g of 95% sulfuric acid and 60.0 g of 85% phosphoric acid, after which 4.34 g of paraformaldehyde (reagent from Aldrich Co.; purity, 95%) was poured in at 25° C. or below and stirring was carried out at room temperature for 1 hour, then at 40° C. for another 3 hours. The resulting reaction mixture was treated in the same way as in Example 1, giving 36.4 g of a yellow diazo resin (the reaction product of about 1.5 moles of formaldehyde per 1.0 mole of a water-soluble salt of 4-diazodiphenylamine). Next, 36.4 g of the resulting diazo resin was dissolved in 160 g of water, then dispersed in 1.3 liters of isopropyl alcohol and left at rest for 1 hour. This was then filtered, washed with 0.2 liter of isopropyl alcohol to which 0.5 g of a fluorine compound (composed primarily of Existing Chemical. Substance 7-1320) had been added, and dried at 50° C. or below, giving 32.1 g of purified diazo resin.

Comparative Example 1

Aside from using 93.0 g of 95% sulfuric acid in preparing the diazo resin of Example 1, 30.0 g of green-yellow diazo resin was obtained in the same way as in Example 1.

Comparative Example 2

Aside from using 93.0 g of 85% phosphoric acid in preparing the diazo resin of Example 1, 29.5 g of light-yellow diazo resin was obtained in the same way as in Example 1.

2. Production of Photosenitive Resin Composition
(1)

Emulsion 1:
A partially saponified polyvinyl alcohol having a degree of saponification of 88 mol %, 150 g (Gohsenol GH-17, from Nippon Synthetic Chemical Industry Co., Ltd.), was dissolved in 850 g of water, giving an aqueous solution of a partially saponified polyvinyl alcohol. Next, 58.5 g of a vinyl acetate/ethylene copolymer emulsion (Polysol AD-51, from Showa Polymer KK; solids concentration, 55 to 57 wt %) was added to 90 g of this aqueous solution of a partially saponified polyvinyl alcohol, and mixture was carried out using a stirrer.

Emulsion 2:
A partially saponified polyvinyl alcohol having a degree of saponification of 88 mol %, 150 g (Gohsenol GH-17, from Nippon Synthetic Chemical Industry Co., Ltd.), was dissolved in 850 g of water, giving an aqueous solution of a partially saponified polyvinyl alcohol. Next, 27 g of a solution composed of 36.3% of an oligoester acrylate (Aronix M-211B, from Toagosei Co., Ltd.), 54.5 wt % of pentaerythritol acrylate (Viscoat #300, from Osaka Organic Chemical Industry, Ltd.), and 8.0 wt % of a photopolymerization initiator (Irgacure 184, from BASF) was added to 90 g of this aqueous solution of a partially saponified polyvinyl alcohol, and mixture was carried out using a stirrer.

Emulsion 3:

A partially saponified polyvinyl alcohol having a degree of saponification of 88 mol %, 150 g (Gohsenol GH-17, from Nippon Synthetic Chemical Industry Co., Ltd.), was dissolved in 850 g of water, giving an aqueous solution of a partially saponified polyvinyl alcohol. Next, 58.5 g of an emulsion of a vinyl acetate/ethylene copolymer (Polysol AD-51, from Showa Polymer KK; solids concentration, 55 to 57 wt %) and 27 g of a solution composed of 36.3 wt. % of an oligoester acrylate (Aronix M-210, from Toagosei Co., Ltd.), 54.5 wt % of pentaerythritol acrylate (TMM-3, from Shin-Nakamura Chemical Co., Ltd.), and 8.0 wt % of a photopolymerization initiator (Irgacure 184, from BASF) was added to 90 g of this aqueous solution of a partially saponified polyvinyl alcohol, and mixture was carried out using a stirrer.

To each of above Emulsions 1, 2 and 3 were added and mixed 1.1 g of 20 wt % aqueous solutions of the diazo resins of Example 1, Example 2, Example 3, Comparative Example 1 and Comparative Example 2 and 0.08 g of an 18% aqueous solution of phthalocyanine blue pigment dispersed in the above-mentioned aqueous solution of a partially saponified polyvinyl alcohol. The resulting mixtures were filtered with a 325-mesh Tetoron® screen and left at rest for 12 hours, thereby producing 15 types of photosensitive resin compositions.

3. Photosensitive Film (1)

Direct Method

Using a bucket squeegee, the 15 types of photosensitive resin compositions obtained were repeatedly coated and dried onto a 250-mesh Tetoron® screen fabric, thereby producing 15 types of photosensitive films for screen plates, each having a surface film thickness of 10 μm.

Evaluation 1: Platemaking Test

A Calculator Exposure XO (from Autotype) was vacuum-contacted to each of these 15 types of photosensitive film, after which 40 seconds of light exposure was carried out using a metal halide exposure system from Dainippon Screen Mfg. Co., Ltd. Following exposure, water development was carried out, thereby producing screen plates on which an image had been formed. The Calculator Exposure XO (from Autotype) image was visually checked on each of the resulting 15 types of screen plates. The results indicated in Table 1 were obtained for the respective photosensitive films. In the table, "Exc" indicates that the image was excellent (that is, the exposure latitude was very wide), "Good" indicates that the image was good (that is, the exposure latitude was good), "Fair" indicates that the image was in the usable range, and "NG" indicates that the image was not usable.

Evaluation 2: Storage Stability Test

The above 15 types of photosensitive films for screen plates were stored at room temperature (about 25° C.) for 30 days, following which images were formed by the same method as that used in the platemaking test. Each of the images thus obtained was visually checked and the storage stability was confirmed. The results indicated in Table 1 were obtained for the respective photosensitive films. "Good" indicates that the image was good (i.e., the exposure latitude was good), "Fair" indicates that the image was in the usable range, and "NG" indicates that the image was not usable.

Evaluation 3: Printing Test Screen printing was carried out with each of the 15 types of screen plates having images formed thereon that were obtained in the platemaking test, and using the UV ink for membranes MS-550U (from Megami-Ink, Inc.). The results indicated in Table 1 were obtained for the respective screen plates. "Exc" indicates that the printed image had an, excellent resolution (that is, the exposure latitude was very wide), "Good" indicates that the printed, image had a good resolution (that is, the exposure latitude was good), "Fair" indicates that the image was in the usable range, and "NG" indicates that the image was not usable.

TABLE 1

| | Test | Example 1 | Example 2 | Example 3 | Comp. Ex. 1 | Comp. Ex. 2 |
|---|---|---|---|---|---|---|
| Emulsion 1 | Platemaking test | Good | Good | Exc | Fair | Fair |
| | Storage stability test | Good | Good | Good | Fair | Good |
| | Printing test | Good | Good | Exc | Fair | Fair |
| Emulsion 2 | Platemaking test | Good | Good | Exc | Good | NG |
| | Storage stability test | Good | Good | Good | NG | Good |
| | Printing test | Good | Good | Exc | Good | Fair |
| Emulsion 3 | Platemaking test | Good | Good | Exc | Fair | Fair |
| | Storage stability test | Good | Good | Good | NG | Good |
| | Printing test | Good | Good | Exc | Good | Fair |

As is apparent from Table 1, the photosensitive films containing diazo resins of the invention in Examples 1, 2 and 3, when compared with the photosensitive films containing conventional diazo resins in Comparative Examples 1 and 2, had an excellent stability over time and a wide exposure latitude. In particular, the photosensitive film containing the diazo resin of Example 3 exhibited a superb exposure latitude and image resolution.

4. Photosensitive Resin Composition (2)

Emulsion 4:

A partially saponified polyvinyl alcohol having a degree saponification of 88 mol %, 150 g (Gohsenol GH-17, from Nippon Synthetic Chemical Industry Co., Ltd.), was dissolved in 850 g of water, giving an aqueous solution of a partially saponified polyvinyl alcohol. Next, 30 g of a solution composed of 10.0 wt % of urethane acrylate (Kayarad UX-4101, from Nippon Kayaku Co., Ltd.), 88.0 wt % of 2-hydroxyphenoxypropyl acrylate (R-128H, from Nippon Kayaku Co., Ltd.) and 2.0 wt % of a photopolymerization initiator (Kayacure DETX-S:DMBI=1:1; from Nippon Kayaku Co., Ltd.) was added to 70 g of this aqueous solution of a partially saponified polyvinyl alcohol, and mixture was carried out using a stirrer.

Next, 1.1 g of 20% aqueous solutions of the diazo resins of Example 1, Example 2, Example 3, Comparative Example 1 and Comparative Example 2, and 0.08 g of an 18% aqueous solution of phthalocyanine blue pigment dispersed in the above-described aqueous solution of partially saponified polyvinyl alcohol were added to and mixed with Emulsion 4, following which this was filtered with a 500-mesh Tetoron® screen, thereby producing five types of photosensitive resin composition.

5. Photosensitive Film (2)

Direct/Indirect Method

An aqueous solution of 100 g of a substantially completely saponified polyvinyl alcohol (Kuraray Poval 105, from Kuraray Co., Ltd.) dissolved in 900 g of water was coated onto a polyester film (Lumirror S10, from Toray Industries, Inc.; thickness, 50 μm), then dried at 80° C. for 2 minutes, thereby giving a film base coated with 2 g/m² of the partially saponified polyvinyl alcohol. Each of the above five types of photosensitive resin composition was applied to and dried on this film base, giving photosensitive films coated with 13 g/m² of solids.

Each of the resulting photosensitive film was placed on a screen frame over which was stretched a 325 mesh Tetoron® screen fabric and the photosensitive films were adhered thereto while applying from the back side and drying the same respective photosensitive resin composition, after which the surface polyester film was stripped away, thereby giving five photosensitive films for screen plates, each having a surface film thickness of 10 μm.

Evaluation 1: Platemaking Test

The five types photosensitive films for screen plates thus obtained were exposed to light using a Calculator Exposure XO (from Autotype), then developed with water, thereby forming images. The Calculator Exposure XO (from Autotype) image was visually checked on each of the resulting five types of screen plates. The results indicated in Table 2 were obtained for the respective photosensitive films. In the table, "Exc" indicates that the image was excellent (that is, that the exposure latitude was very wide), "Good" indicates that the image was good (that is, the exposure latitude was good), "Fair" indicates that the image was in the usable range, and "NG" indicates that the image was not usable.

Evaluation 2: Storage Stability Test

A storage stability test was carried out that entailed storage of the above five types of photosensitive resin compositions under two sets of conditions: storage at room temperature (about 25° C.) for 30 days (Storage Stability Test 1), or storage at 40° C. for 7 days (Storage Stability Test 2), following which images were formed by the same method as that used in the platemaking test. The resulting images were visually checked and the storage stability was confirmed. The results indicated in Table 2 were obtained, for the respective photosensitive films. "Good" indicates that the image was good (i.e. a good exposure latitude), "Fair" indicates that the image was in the usable range, and "NG" indicates that the image was not usable.

As is apparent from Table 2, the photosensitive resin compositions containing the inventive diazo resins of Examples 1, 2 and 3, when compared with the photosensitive resin compositions containing the conventional diazo resins of Comparative Examples 1 and 2, gave photosensitive films having an excellent stability over time and a wide exposure latitude. In particular, the photosensitive film containing the diazo resin of Example 3 exhibited a superb exposure latitude.

6. Photosensitive Film (3)

Tests of Water Resistance and Solvent Resistance

Three types of photosensitive resin compositions were prepared by adding 2.0 g of a 20% aqueous solution of the diazo resin of above Examples 1, Example 2 or Example 3 and 1.08 g of an 18% aqueous solution of phthalocyanine blue pigment dispersed in an aqueous solution of partially saponified polyvinyl alcohol to Emulsion 4 and mixing, then filtering the mixture with a 500-mesh Tetoron® screen and leaving the filtered mixture at rest for 12 hours.

Each of the above three types of photosensitive resin compositions was applied onto a polyester film (Lumirror S10 and thickness 50 μm from Toray Industries, Inc.) and dried, thereby giving in each case a photosensitive film coated with 13 g/m² of solids. Each of these photosensitive films was then subjected to light exposure and water development, and subsequently dried. In addition, after drying, each of the three types of film was formed into five test specimens cut to a size of 30 mm×30 mm.

Next, durability tests were carried out by the methods shown below using three different liquids: butyl carbitol acetate (BOA), which is a major solvent in printing inks; acetone, which is a major solvent in screen plate washing fluids; and water, which is a major solvent in printing inks and screen plate washing fluids, and also is present at a high concentration in the atmosphere during the rainy season. First, the initial weight $W0$ of each test specimen was measured, following which the specimens were immersed in BOA, acetone or water. After three hours, the specimens were removed from the liquids and the weights $W1$ of the specimens were measured after wiping the liquid from the surfaces of the specimens. The specimens were then dried and the specimen weights after drying $W2$ were measured. Table 3 shows the values obtained by calculating the average percent swelling and the average percent dissolution and removal for the five test specimens of each type of photosensitive film.

The percent swelling was calculated using the formula $$\text{Percent swelling (\%)}=((W1-W2)\times100)/W2.$$

The percent dissolution was calculated using the formula $$\text{Percent dissolution (\%)}=((W0-W2)\times100)/W0$$

TABLE 2

| | Test | Example 1 | Example 2 | Example 3 | Comp. Ex. 1 | Comp. Ex. 2 |
|---|---|---|---|---|---|---|
| Emulsion 4 | Platemaking test | Good | Good | Exc | NG | Fair |
| | Storage stability test (1) | Good | Good | Good | NG | Good |
| | Storage stability test (2) | Good | Good | Good | NG | Good |

TABLE 3

| Test | | Example 1 + Emulsion 4 | Example 2 + Emulsion 4 | Example 3 + Emulsion 4 |
|---|---|---|---|---|
| BCA | Percent swelling | 3.10 | 2.44 | 2.81 |
| | Percent dissolution/removal | 1.34 | 1.29 | 0.56 |
| Acetone | Percent swelling | 3.12 | 2.60 | 1.15 |
| | Percent dissolution/removal | 1.91 | 1.80 | 0.77 |
| Water | Percent swelling | 1.87 | 0.92 | 1.36 |
| | Percent dissolution/removal | 0.74 | 0.75 | 1.14 |

As is apparent from Table 3, cured resins obtained from photosensitive films containing the inventive diazo resins of Examples 1 to 3 showed only about 3% or less swelling or dissolution and removal in any of the liquids BCA, acetone and water, indicating that the water resistance and the solvent resistance were excellent. In particular, the percent dissolution removal by BCA and acetone in cured resins obtained from the photosensitive film containing the diazo resin of Example 3 was, very low, from which it was apparent that the photosensitive film containing the diazo resin of Example 3 gives a cured resin having a particularly outstanding solvent resistance.

Emulsion 5

An aqueous solution of an acrylamide-modified partially saponified polyvinyl alcohol was obtained by dissolving 150 g of acrylamide-modified partially saponified polyvinyl alcohol having a degree of saponification of 88 mol % (Denka Poval EP-240, from Denki Kagaku Kogyo KK) in 850 g of water.

Next, an aqueous solution containing 15 wt % of a partially saponified polyvinyl alcohol to which had been added 1.2 mol % of styrylpyridinium groups (referred to below as "SBQ Polymer") was obtained by an acetalization reaction in water between a partially saponified polyvinyl alcohol polymer having a degree of saponification of 88 mol % (Gohsenol GH-17, from Nippon Synthetic Chemical Industry Co., Ltd.) and N-methyl-γ-(p-formylstyryl)pyridinium methosulfate.

In addition, using MR-2G from Soken Chemical Engineering Co., Ltd. as a crosslinked acrylic resin powder, an aqueous dispersion containing 30 wt % of this powder, a 15% solution of a low-molecular-weight partially saponified polyvinyl alcohol (Gohsenol. GL-05F, from Nippon. Synthetic Chemical Industry Co., Ltd.) and a foam inhibitor was obtained Next, 6.18 g of the aqueous solution of the above SBQ polymer and 37.23 g of a low-viscosity polyvinyl acetate emulsion (50 M, from Nichigo-Movinyl Co., Ltd.; solids concentration, 50%) as a hydrophobic polymer dispersion were mixed together with 6.12 g of the aqueous solution of the acrylamide-modified partially saponified polyvinyl alcohol, and stirring was carried out. Next, 5.52 g of a dispersion of the crosslinked acrylic resin powder, 1.0 g of the diazo resin of Example 4, and 1.5 g of an aqueous solution containing phthalocyanine blue pigment in an amount of 18 wt % (EP-520 BLUE 2B, from Dainichiseika Color & Chemicals Mfg. Co., Ltd.) were mixed together and stirred, giving a photosensitive resin composition (Emulsion 5).

Production of Screen Plate

The above photosensitive resin composition was repeatedly applied to and dried on a 150-mesh Tetoron® screen fabric, thereby producing a digital screen platemaking photosensitive film having a surface film thickness of 10 µm. An inkjet digital platemaking system for screen printing (Screenmaster, from Seiko Epson Corporation) was used to write, with inkjet ink, a light-shielding black image (lines and dots) on the digital screen platemaking photosensitive film. Next, the image was exposed to light for 40 seconds using a metal halide exposure system (from Dainippon Screen Mfg. Co., Ltd.), then developed with water, giving a screen plate with a blue image formed thereon.

Printing Evaluation

A banner was printed using the above screen plate and the results obtained in the presence and absence of the fluorine compound used in Example 4 were compared, whereupon the screen plate from a fluorine compound-containing diazo resin exhibited less ink scatter during printing.

Emulsion 6

Emulsion 6 was prepared by adding 2 wt % of a fluorine compound to Emulsion 1, and the discharge of static electricity compared with that for Emulsion 1 was investigated. The results shown in Table 4 below were obtained.

TABLE 4

| Emulsion 1 | ① Immediately after static buildup (kV) | ② After 60 seconds (kV) | ③ After 300 seconds (kV) | ④ Amount of discharge after 60 seconds (%) | ⑤ Amount of discharge after 300 seconds (%) |
|---|---|---|---|---|---|
| Average value | 10.56 | 7.72 | 5.11 | 27.3 | 52.4 |
| Emulsion 6 | ① Immediately after static buildup (kV) | ② After 60 seconds (kv) | ③ After 300 seconds (kV) | ④ Amount of discharge after 60 seconds (%) | ⑤ Amount of discharge after 300 seconds (%) |
| Average value | 11.25 | 6.89 | 3.29 | 39.0 | 70.9 |

Average value for n = 5
① Immediately after static buildup (kV) = Electrostatic potential immediately after surface was rubbed with polyvinyl chloride
② After 60 seconds (kV) = Electrostatic potential 60 seconds after (1)
③ After 300 seconds (kV) = Electrostatic potential 300 seconds after (1)
④ Amount of discharge after 60 seconds (%) = [(① − ②)/①] × 100
⑤ Amount of discharge after 300 seconds (%) = [(① − ③)/①] × 100

Emulsion 7

Emulsion 7 was prepared by adding a fluorinated (meth) acrylate (LINC-102A, from Kyoeisha Chemical Co., Ltd.) as 10% of the total acrylic component to above Emulsion 4. The resolution compared with that of Emulsion 4 was investigated, whereupon the L/S (lines and spaces) went from 50 µm to 30 µm, indicating a clear increase in resolution.

Emulsion 8

Emulsion 8 was prepared by changing 10.0 wt % of the urethane acrylate (Kayarad UX-4101, from Nippon Kayaku Co., Ltd.) within the acrylic component of Emulsion 4 to a caprolactone-modified polyacrylate of dipentaerythritol hexacrylate (DPHA) (Kayarad DPCA-60, from Nippon Kayaku Co., Ltd.). The resolution compared with that of Emulsion 7 was investigated, whereupon the L/S (lines and spaces) went from 30 μm to 20 μm, indicating a further increase in resolution.

Emulsion 9

Emulsion 9 was prepared by adding 10% of a polymer emulsion of poly(methyl methacrylate:2-ethylhexyl acrylate=1:1) to Emulsion 7 Using a rubbing tester, an abrasion resistance test was carried out in water, whereupon the abrasion resistance clearly increased compared with Emulsion 7.

Emulsion 10

Emulsion 10 was prepared by using the above-mentioned SBQ Polymer instead of the partially saponified polyvinyl alcohol having a degree of saponification of 88 mol % (Gohsenol GH-17, from Nippon Synthetic Chemical Industry Co., Ltd.) used in Emulsion 9. The sensitivity and resolution were compared with those of Emulsion 9, whereupon the resolution was about the same but the sensitivity was clearly improved.

Emulsion 11

Emulsion 11 was prepared by using, instead of the SBQ Polymer used in Emulsion 10, a partially saponified polyvinyl alcohol to which 1.3 mol % of styrylpyridinium groups had been added (referred to below as the "SBQII Polymer") by an acetalization reaction, in water, between a partially saponified polyvinyl alcohol polymer having a degree of saponification of 88 mol % (Gohsenol from Nippon Synthetic Chemical Industry Co., Ltd.; GH-17:EG-05=9:1) and N-methyl-γ-(p-formylstyryl)pyridinium methosulfate. The sensitivity and resolution were compared with those of Emulsion 10, whereupon the sensitivity was about the same but the resolution was clearly improved.

Emulsion 12

Emulsion 12 was prepared by using, instead of the SBQII Polymer used in Emulsion 11, a partially saponified polyvinyl alcohol to which 0.9 mol % of styrylpyridinium groups had been added (referred to below as the "SBQIII" Polymer) by an acetalization reaction, in water, between a partially saponified polyvinyl alcohol polymer having a degree of saponification of 88 mol % (Kuraray Poval 224, from Kuraray Co., Ltd.; degree of polymerization, about 2,400) and N-methyl-γ-(p-formylstyryl)pyridinium methosulfate. The sensitivity and solvent resistance were compared with those of Emulsion 11, whereupon the sensitivity and the solvent resistance (such as to glycol ether) were both vastly improved.

As in Table 1, the results in Tables 5 and 6 were obtained by conducting platemaking tests, storage stability tests and printing tests on Emulsions 5 to 12.

TABLE 5

| | Test | Example 1 | Example 2 | Example 3 | Comp. Ex. 1 | Comp. Ex. 2 |
|---|---|---|---|---|---|---|
| Emulsion 5 | Platemaking test | Exc | Good | Good | Fair | NG |
| | Storage stability test | Good | Good | Good | Fair | Good |
| | Printing test | Exc | Good | Good | Fair | Fair |
| Emulsion 6 | Platemaking test | Good | Good | Exc | Good | Fair |
| | Storage stability test | Good | Good | Good | NG | Good |
| | Printing test | Exc | Exc | Exc | Good | Good |
| Emulsion 7 | Platemaking test | Good | Good | Good | Fair | Good |
| | Storage stability test | Good | Good | Exc | Fair | Good |
| | Printing test | Exc | Exc | Exc | Good | Good |
| Emulsion 8 | Platemaking test | Exc | Exc | Exc | Good | Good |
| | Storage stability test | Good | Good | Good | NG | Good |
| | Printing test | Good | Good | Exc | Good | Fair |

TABLE 6

| | Test | Example 1 | Example 2 | Example 3 | Comp. Ex. 1 | Comp. Ex. 2 |
|---|---|---|---|---|---|---|
| Emulsion 9 | Platemaking test | Exc | Exc | Exc | Fair | Fair |
| | Storage stability test | Good | Good | Exc | Fair | Good |
| | Printing test | Exc | Exc | Exc | Good | Fair |
| Emulsion 10 | Platemaking test | Good | Good | Good | Good | Good |
| | Storage stability test | Good | Good | Good | NG | Good |
| | Printing test | Good | Good | Exc | Good | Fair |
| Emulsion 11 | Platemaking test | Exc | Exc | Exc | Good | Good |
| | Storage stability test | Good | Good | Good | Fair | Good |
| | Printing test | Good | Good | Exc | Good | Good |
| Emulsion 12 | Platemaking test | Good | Good | Exc | Fair | Fair |
| | Storage stability test | Good | Good | Good | NG | Good |
| | Printing test | Exc | Exc | Exc | Good | Good |

When the screen plate reinforcing solution composed of dilute hydrochloric acid and an aqueous solution of glutaraldehyde described on page 22, line 19 to page 23, line 4 of the Specification was used on the screen plate described on page 33, lines 1 to 10, the water resistance of the screen plate improved.

When propylene glycol was added to this screen plate reinforcing solution, plates having both water resistance and chemical resistance were obtained.

INDUSTRIAL APPLICABILITY

The inventive diazo resins and photosensitive resin compositions containing such diazo resins are particularly useful for producing screen plates, although they can be used for such purposes as photoresists, and also cushioning agents for metal masks, that have water resistance, solvent resistance and chemical resistance. In addition they can be used in, for example, screen plates or films for direct digital platemaking systems which use as the output device an inkjet printer or an infrared or ultraviolet laser.

The invention claimed is:

1. A photosensitive resin composition for a screen plate, comprising:
   an aqueous dispersion obtained by dispersing (A) a diazo resin and (B) a water-soluble polymer selected from among polyvinyl alcohol and partially saponified polyvinyl alcohol,
   into an aqueous solution containing (C) at least one of (c-1) and (c-2) below, wherein
   (c-1) a mixture of an oil-soluble photopolymerization initiator and a water-insoluble or sparingly water-soluble compound having at least one photoactive, ethylenically unsaturated group,
   (c-2) a polymer emulsion,
   the diazo resin (A) is a photocrosslinkable water-soluble diazo resin obtained by condensing a water-soluble salt of an optionally substituted 4-diazodiphenylamine with formaldehyde in the presence of a mixture sulfuric acid and phosphoric acid, and
   a weight ratio of the sulfuric acid to the phosphoric acid is 0.5:99.5 to 99.5:0.5.

2. The photosensitive resin composition for a screen plate according to claim 1, comprising a diazo resin for which the molar ratio of the water-soluble salt of an optionally substituted 4-diazodiphenylamine to formaldehyde is in the range of 1:0.5 to 1:3.0.

3. The photosensitive resin composition for a screen plate according to claim 1, comprising a diazo resin for which the water-soluble salt of an optionally substituted 4-diazodiphenylamine is 4-diazodiphenylamine hydrogen sulfate or 4-diazo-3-methoxydiphenylamine hydrogen sulfate.

4. The photosensitive resin composition for a screen plate according to claim 1, comprising a diazo resin for which the weight ratio of the sulfuric acid to the phosphoric acid is in the range of 40:60 to 60:40 and the molar ratio of the water-soluble salt of an optionally substituted 4-diazodiphenylamine to formaldehyde is in the ratio of 1:0.5 to 1:1.10.

5. The photosensitive resin composition for a screen plate according to claim 1, comprising a diazo resin for which the weight ratio of the sulfuric acid to the phosphoric acid is in the range of 5:95 to 20:80, and the molar ratio of the water-soluble salt of an optionally substituted 4-diazodiphenylamine to formaldehyde is in the ratio of 1:1.1 to 1:3.0.

6. The photosensitive resin composition for a screen plate according to claim 1, comprising a diazo resin to which an organic acid has been added at the time of diazo resin production.

7. The photosensitive resin composition for a screen plate according to claim 1, comprising a diazo resin to which citric acid has been added at the time of diazo resin production.

8. The photosensitive resin composition for a screen plate according to claim 1, comprising a diazo resin to which a fluorine compound has been added at the time of diazo resin production.

9. The photosensitive resin composition for a screen plate according to claim 1, wherein the component (B) is a partially saponified polyvinyl alcohol to which from 0.9 to 2.0 mol % of styrylpyridinium groups have been added by an acetalization reaction between a partially saponified polyvinyl alcohol polymer having a degree of saponification of 88 mol % (average degree of polymerization, 1,000 to 1,700) and N-methyl-γ-(p-formylstyryl)pyridinium methosulfate.

10. The photosensitive resin composition for a screen plate according to claim 1, wherein the component (B) is a partially saponified polyvinyl alcohol to which from 0.7 to 1.0 mol % of styrylpyridinium groups have been added by an acetalization reaction between a partially saponified polyvinyl alcohol polymer having a degree of saponification of 88 mol % (average degree of polymerization, 2,000 to 2,500) and N-methyl-γ-(p-formylstyryl)pyridinium methosulfate.

11. The photosensitive resin composition for a screen plate according to claim 1, which uses/includes a fluorinated (meth)acrylate as the component (c-1).

12. The photosensitive resin composition for a screen plate according to claim 1, to which a fluorine compound has been added.

13. The photosensitive resin composition for a screen plate according to claim 1, which uses/includes caprolactone-modified polyacrylate as the component (c-1).

14. The photosensitive resin composition for a screen plate according to claim 1, which uses/includes polyester (meth)acrylate as the component (c-1).

15. The photosensitive resin composition for a screen plate according to claim 1, which uses/includes a polymer emulsion of poly(methyl methacrylate:2-ethylhexyl acrylate=1:1) as the component (c-2).

16. The photosensitive resin composition for a screen plate according to claim 1, which is used in production of a screen printing plate.

17. A photosensitive film formed from the photosensitive resin composition for a screen plate according to claim 1.

18. A screen plate, which is obtained by using a photosensitive film formed from the photosensitive resin composition for a screen plate according to claim 1.

19. The screen plate according to claim 18, which is obtained by using a screen plate reinforcing solution containing an aqueous solution composed primarily of dilute hydrochloric acid, glutaraldehyde and propylene glycol on a photosensitive film obtained by exposing to light and developing the photosensitive film.

* * * * *